(12) United States Patent
Babcock et al.

(10) Patent No.: US 6,958,523 B2
(45) Date of Patent: Oct. 25, 2005

(54) ON CHIP HEATING FOR ELECTRICAL TRIMMING OF POLYSILICON AND POLYSILICON-SILICON-GERMANIUM RESISTORS AND ELECTRICALLY PROGRAMMABLE FUSES FOR INTEGRATED CIRCUITS

(75) Inventors: Jeffrey A. Babcock, Neufahrn (DE); Angelo Pinto, Buch Am Erlbach (DE); Gregory E. Howard, Dallas, TX (US); Philipp Steinmann, Richardson, TX (US); Scott Balster, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 575 days.

(21) Appl. No.: 09/949,541

(22) Filed: Sep. 7, 2001

(65) Prior Publication Data
US 2002/0033519 A1 Mar. 21, 2002

Related U.S. Application Data
(60) Provisional application No. 60/232,926, filed on Sep. 15, 2000.

(51) Int. Cl.[7] .............................................. H01L 29/00
(52) U.S. Cl. ......................... 257/538; 257/539; 257/537
(58) Field of Search ................................. 257/538, 536, 257/528, 539, 537

(56) References Cited

U.S. PATENT DOCUMENTS

| | | | | |
|---|---|---|---|---|
| 4,210,996 A | * | 7/1980 | Amemiya et al. | 257/536 |
| 4,285,001 A | * | 8/1981 | Gerzberg et al. | 357/51 |
| 4,947,020 A | * | 8/1990 | Imamura et al. | 219/121.65 |
| 5,296,722 A | * | 3/1994 | Potash et al. | 257/50 |
| 5,466,484 A | * | 11/1995 | Spraggins et al. | 257/536 |
| 5,682,049 A | * | 10/1997 | Nguyen | 257/363 |
| 2002/0008302 A1 | * | 1/2002 | Singh et al. | 257/538 |

* cited by examiner

*Primary Examiner*—Jerome Jackson
*Assistant Examiner*—Jesse Fenty
(74) *Attorney, Agent, or Firm*—Peter K. McLarty; W. James Brady, III; Frederick J. Telecky, Jr.

(57) ABSTRACT

An integrated circuit programmable structure (60) is formed for use a trim resistor and/or a programmable fuse. The programmable structure comprises placing heating elements (70) in close proximity to the programmable structure (60) to heat the programmable structure (60) during programming.

6 Claims, 6 Drawing Sheets

ON CHIP HEATING FOR ELECTRICAL TRIMMING OF POLYSILICON AND POLYSILICON-SILICON-GERMANIUM RESISTORS AND ELECTRICALLY PROGRAMMABLE FUSES FOR INTEGRATED CIRCUITS

This application claims priority under 35 USC § 119(e)(1) of provisional application Ser. No. 60/232,926, filed Sep. 15, 2000.

FIELD OF THE INVENTION

The present invention relates to an on chip heating device and method for use in trimming polysilicon and polysilicon-silicon-germanium resistors and for heat augmented electrical programming of fuses for integrated circuits.

BACKGROUND OF THE INVENTION

High-speed precision analog and mixed-signal IC applications, (such as low offset voltage operational amplifiers, analog frequency tuning circuits, voltage controlled oscillators, and analog-to-digital (ADC) and digital-to-analog (DAC) converters) require high performance CMOS and BiCMOS technologies that are ultimately limited by the accuracy of both the active and passive components of the technology. Inaccuracies and variations in thin film and thick film resistor deposition typically result in 10% to 20% variation from the designed resistor values, while the best case polycrystalline silicon-germanium (SiGe) resistance variations have been reported at 7.2%.

In addition to active and passive components, it is often necessary to implement a number of one-time programmable-read-only-memory (PROM) elements into analog and/or digital circuits. Typical applications can include; redundancy in SRAMS or other circuit building blocks and electrically programmable feature selection such as capacitance or resistance adjustments in DAC and ADC to increase bit accuracy or improve matching in RF circuit applications.

Electrical trimming of heavily doped polysilicon resistors has been well established as a reliable and manufacturable technique for producing precision resistors in integrated circuits. Although these techniques are highly accurate and easily reproducible, the electrical trim techniques require a high current electrical trim path to the resistor, which may be a severe limitation for many circuit applications. Shown in FIG. 1 is a circuit example which allows for electrical trimming of the resistor by using a diode connected to a trim pad. To trim the resistor 1, diode D1 is forward biased through $V_{cc}$ and the output pad, while a current density greater than $10^6$ A/cm$^2$ is forced through the resistor. During the trim to target value technique, the current is increased (typically as a series of current pulses with increasing amplitudes) until the resistor reaches the desired value for the circuit application. Under normal operating conditions the diodes D1 and D2 are held at $V_{cc}$ or Ground to ensure that the diodes are reversed biased and thus the resistor is electrically isolated from other components within the circuit. Although this method works for some circuit applications, it is of limited use for many circuit applications that cannot have diode connected trim pads or cannot tolerate the high current densities required for trimming the resistors. Because high current densities are required for trimming polysilicon resistors, additional limitations exist regarding the voltages required for trimming resistors greater than several kΩ. These limitations can be equipment related or materials related.

Electrically programmable fuses have been well established for use in integrated circuit applications. However, technology scaling is now beginning to place limitations on the use of electrically programmable fuses because of voltage limitations on gate oxides, interlayer dielectrics, and junction diffused diodes. This trend is expected to become worse as technologies continue to scale and inter-metal dielectrics migrate to low-k dielectric materials. Recent trends have tried to circumvent these limitations by adding high-voltage drain extended structures, dual gate oxide processes, or by utilizing laser trimming techniques. However each of these methods place limitations on the manufacturing of circuits. These limitations include process complexity, increased processing costs, additional die spacing requirements, and/or expensive testing equipment such as that required for laser trimming.

These is therefore a need for a method of trimming integrated circuit resistors and programming integrated circuit fuses that can be implemented on the integrated circuit without addition cost or process complexity.

SUMMARY OF INVENTION

The electrical trimming of integrated circuit resistors and electrical programming of integrated circuit fuses according to the present invention is characterized by forming heating elements in close proximity to the resistor and fuse elements. By flowing current through the heating elements during the resistor trim cycle or fuse programming cycle the current required to trim the resistor or program the fuse is greatly reduced over existing devices. The efficiency of the present invention can be enhanced by forming a silicide film on the resistor and/or fuse element. In the present invention, the resistor, fuse, and heating structures can be formed using polysilicon, polysilicon-germanium, or other suitable silicon containing materials. The advantages of the present invention include providing a simple non-intrusive electrical trimming technique for manufacturing trimmable polysilicon and/or poly-SiGe integrated resistors for high precision IC applications. The above described technique is simple, cost-effective, and adds no process complexity to a standard CMOS or BiCMOS technology. The resistor trimming occurs at much lower current densities than those used in standard polysilicon electrical trimming techniques. This technique also allows electrical testing of the circuit under nominal operating conditions during the resistor trim to target method described above. In addition, diode isolated pads connections are not required for trimming the resistor but can be used. Other technical advantages will be readily apparent to one skilled in the art from the following FIGUREs, description, and claims.

BRIEF DESCRIPTION OF THE DRAWINGS

For a more complete understanding of the present invention and the advantages thereof, reference is now made to the following description taken in conjunction with the accompanying drawings, wherein like reference numerals represent like features, in which.

DETAILED DESCRIPTION OF THE INVENTION

The invention will be described with reference to FIGS. 2–6. It comprises an on chip heater for resistor trimming and fuse programming.

Figure 1:
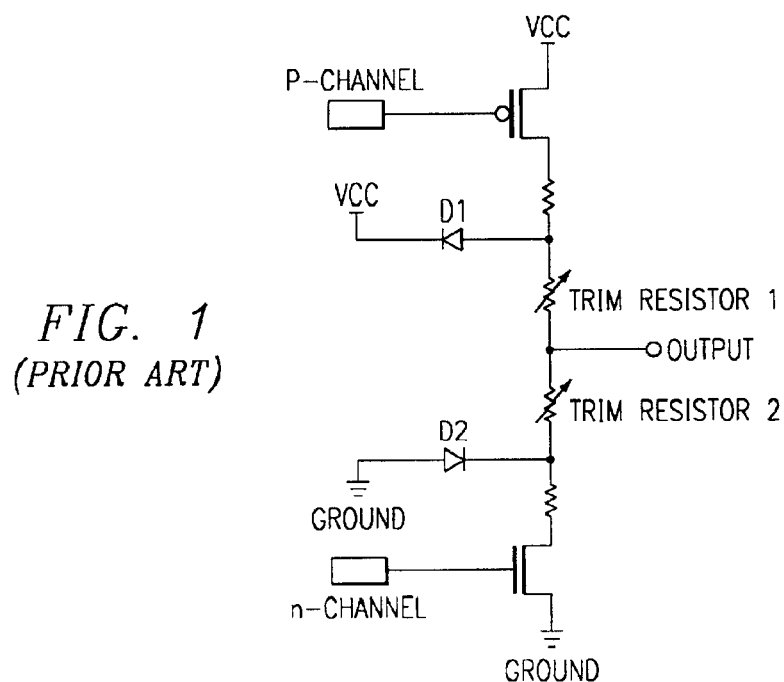
FIG. 1 is a circuit schematic diagram for resistor trimming.
Figure 2A:
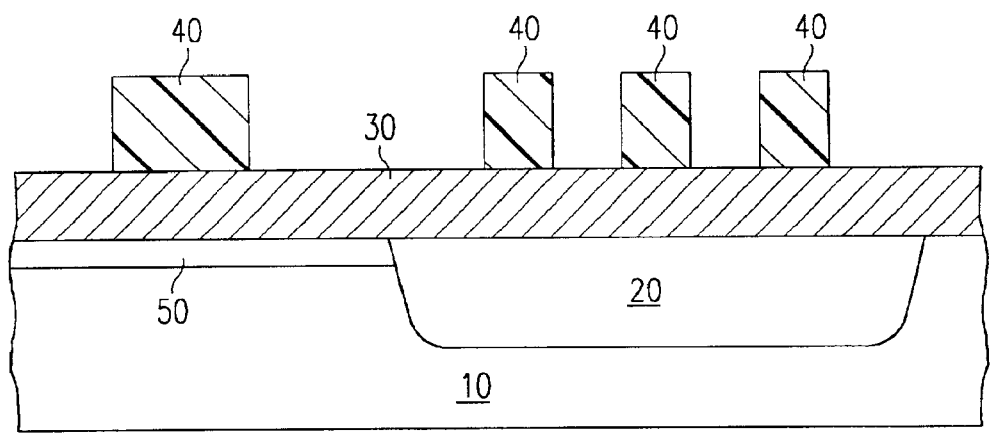
FIGS. 2A–2D are plan and cross-section diagrams showing an embodiment of on chip heating for resistor trimming and fuse programming.

Shown in FIGS. 2A–2D is an embodiment of the instant invention. As shown in FIG. 2A, isolation structures 20 are formed in a substrate wafer 10. The substrate wafer 10 can be a bulk silicon wafer, a silicon wafer with an epitaxial layer, or a silicon-on-insulator (SOI) wafer. An SOI wafer would have a buried insulator layer which is not shown in the Figures for clarity. The isolation structures can be shallow trench isolation (STI) structures or local oxidation (LOCOS) structures. Each of these STI or LOCOS structures can be formed using standard CMOS processing technology. A gate dielectric layer 50 is formed in those regions of the substrate 10 where CMOS circuits will be fabricated. This gate dielectric layer can be an oxide, an oxynitride, a silicate, or any combination of these materials. Following the formation of the gate dielectric layer 50, a gate polycrystalline silicon layer (polysilicon) or polycrystalline silicon-germanium (poly-SiGe) layer 30 is formed on the substrate. This layer 30 will be used to simultaneously form the CMOS transistor gate structures as well as the heating elements, trim resistors, and programmable fuse elements of the instant invention. Following the formation of the polysilicon or poly-SiGe layer 30, a masking film is formed and patterned 40 to define both transistor gate structures as well as the heating and resistor structures.

Figure 2B:
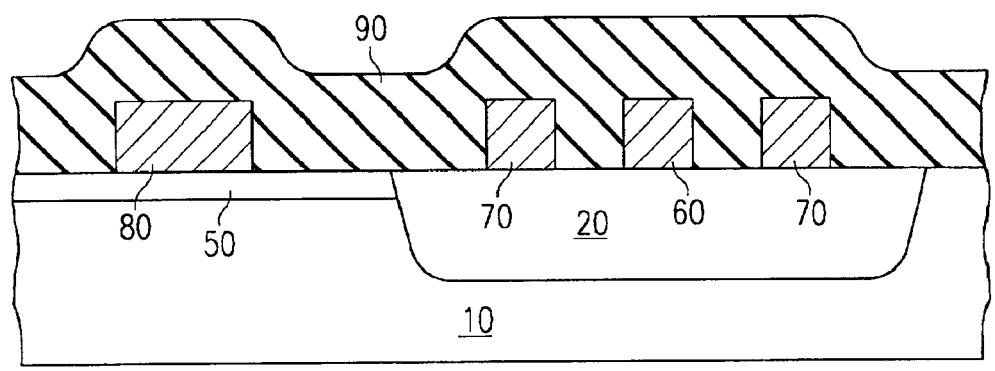
Figure 2C:
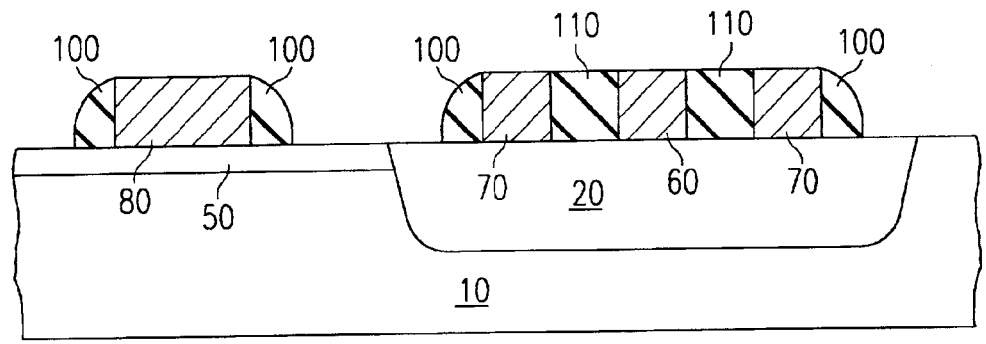
Figure 2D:
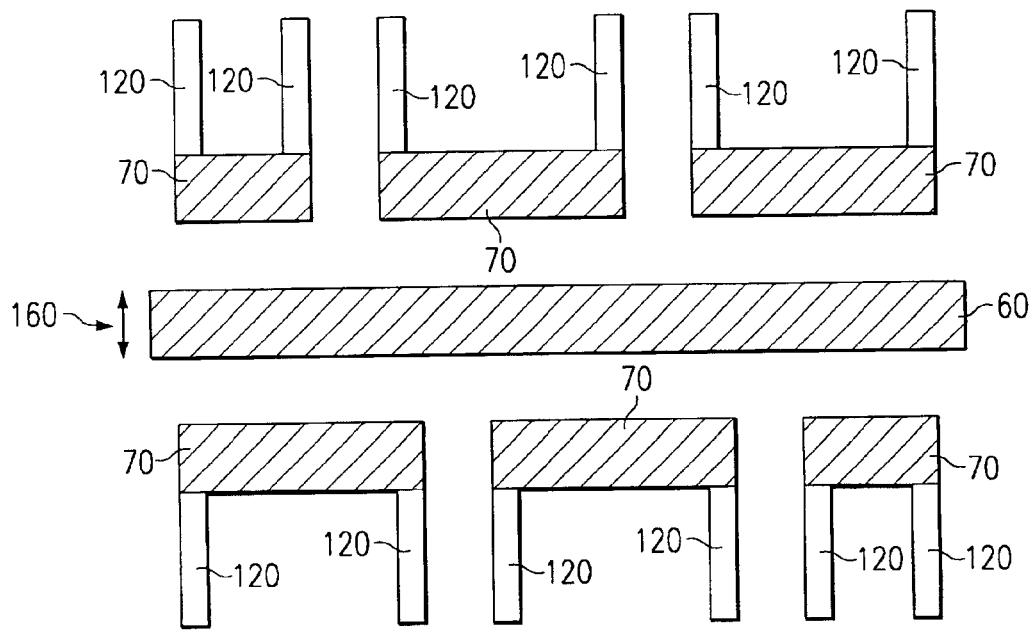

Shown in FIG. 2B is the polysilicon or poly-SiGe layer 30 after etching to simultaneously form the transistor gate structure 80, the heating structures 70 and the resistor structure 60. Following the formation of the structures 60, 70, and 80, a layer containing nitride or oxide 90 is formed on the substrate covering and enclosing the structures 60, 70, and 80. The formation of layer 90 is followed by an etching process that results in the formation of the sidewall structures 100, and the isolation regions 110 that separate the resistor structure 60 from the heater structures 70. This is illustrated in FIG. 2C. An important property of the layer 90 and the isolation regions 110 formed from this layer is that it be an electrical insulator but a good thermal conductor. As described above, silicon nitride and silicon oxide can be used to form region 90 but any material with these properties can also be used to form the layer 90. The gate polysilicon and source-drain implants used as part of the CMOS fabrication process is also used to heavily dope the resistor and heating structures 60 and 70 respectively. Standard semiconductor processing steps such as contacts, via formation, metallization, and passivation can be used to complete the fabrication process. To reduce the input power that must be applied during the resistor trimming process, the layout shown in FIG. 2D can be utilized. Here the heating elements 70 are arranged is short sections along the resistor structure 60. The voltages are applied to the heating elements 70 via the contact lines 120 that electrically contact the heating structures 70.

Figure 3A:
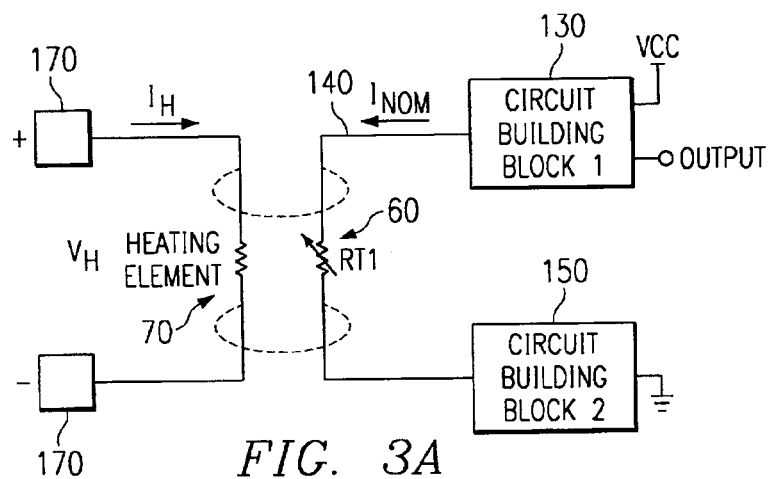
FIGS. 3A–3B are diagrams showing a method for resistor trimming.
Figure 3B:
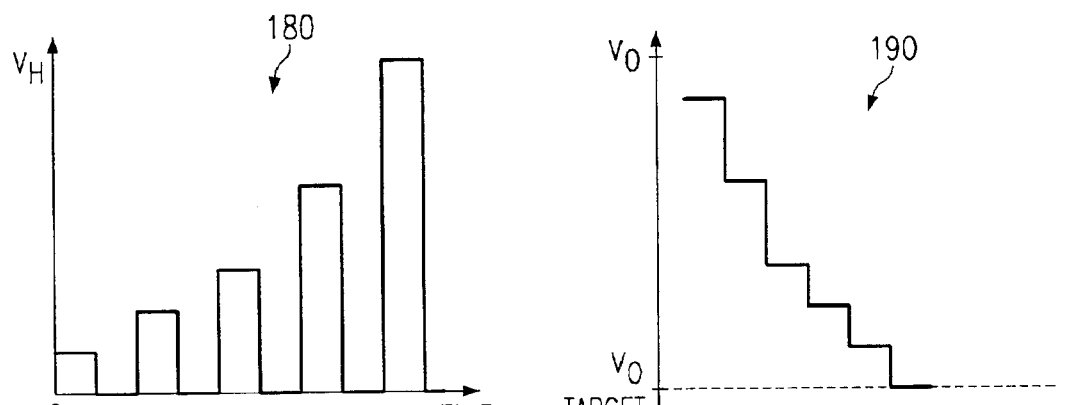

Shown in FIGS. 3A–3B is a methodology for using the structure described in FIGS. 2A–2D to trim the resistance value of the resistor structure 60 which is connected between circuit blocks 130 and 150. The circuit of FIG. 3A is operated under normal operating conditions with a nominal current 140 flowing through the trim resistor 60. A voltage is applied between terminals 170 to produce a current (with sufficiently high density $>10^6$ A/cm$^2$) through the heating resistor (structure) 70 for a pulse duration sufficient to heat the trim resistor such that the nominal operating current can now trim the resistor. During the "off-cycle" of the heating element 70, the nominal circuit operating current 140 flowing through the trim resistor is insufficient to supply heat/energy for trimming to continue. At this point, the temperature in the trim resistor 60 drops rapidly towards the nominal operating temperature of the circuit where the output characteristics can be monitored. If the measured output characteristics of the circuit are not on target (i.e. the resistor is not trimmed to target value) then a new current pulse of increased amplitude (resulting in a higher heating temperature) is applied to the heating element thus coupling more heat into the trim resistor. During this heating cycle the resistor is further trimmed by the nominal current. Again during the "off-cycle" of the heating element, the nominal current 140 flowing through the trim resistor 60 is insufficient to supply heat/energy for trimming to continue. Thus the temperature in the trim resistor again drops rapidly towards the nominal operating temperature of the circuit where the output characteristic is again measured. This heating/trim versus cool-down/measure process algorithm is repeated until the circuit reaches the desired target output value (i.e., trim resistor is equal to target value). Shown in FIG. 3B are diagrams showing the heating element pulse 180 and the output voltage 190 both as a function of time.

The following are some of the key design parameters for the above described embodiment. If trim resistor width (160 in FIG. 2D) is too large then heat coupling into the trim resistor 60 is non uniform and the resistor acts as a heat sink. The resistor should therefore be less than one micron in width although the exact value will depend on the technology used. Parallel resistor structures with heating elements inserted between can allow design methods to overcome this limitation. The use of parallel resistor fingers can allow for thermal resistor control trim engineering of the different resistor fingers during the trim process, hence adding another degree of freedom to the trimming method describe above. In order to maximize the heat coupling between the heating element 70 and the trim resistor structure 60 the separation between these elements must be minimized. Design constraints on this separation include the breakdown voltage characteristic of the dielectric material 110 between the structures, and the capacitive coupling between the trim resistor structure 60 and the heating elements 70.

Figure 4A:
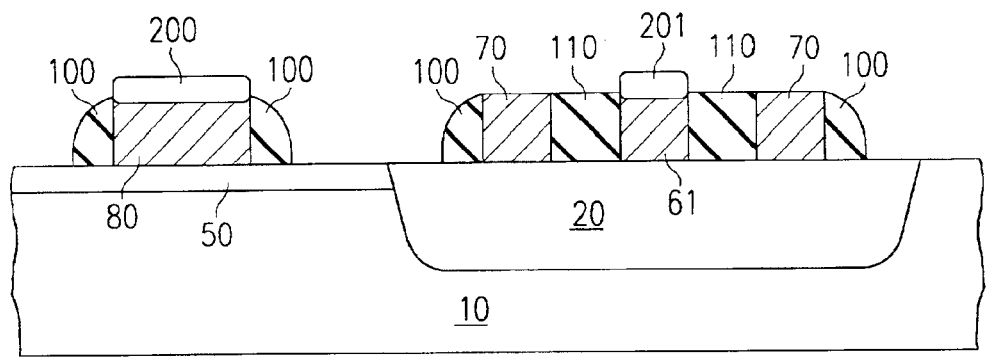
FIGS. 4A–4B are plan and cross-section diagrams showing a further embodiment fuse programming.
Figure 4B:
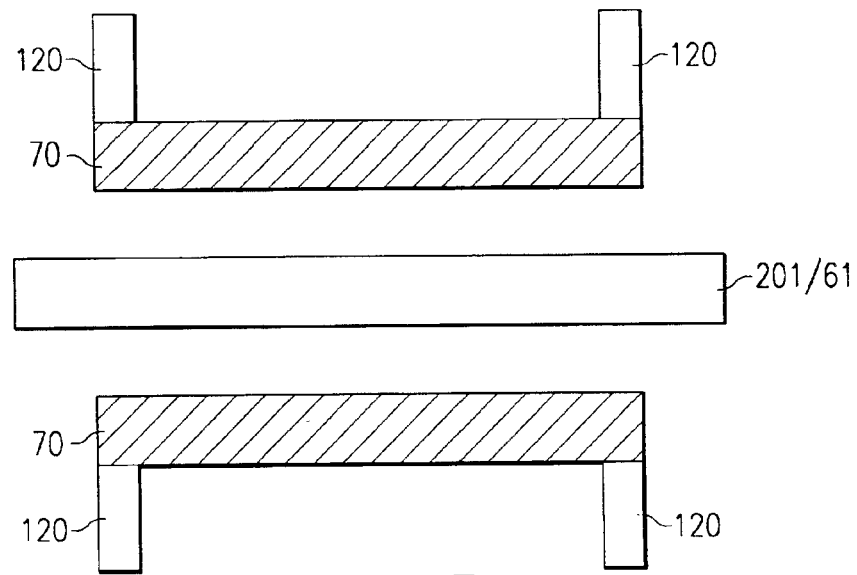

In general, for the structure shown in FIG. 2C to function as a heat augmented programmable fuse, the heating pulse applied must be such that the resistor structure 60 will form an open circuit under nominal current conditions. Another embodiment of the structure of FIG. 2A–2D as a programmable fuse is shown in FIGS. 4A–4B. As shown in FIG. 4A, a silicide film 200 is formed on the transistor gate structure 80 and a silicide film 201 is also formed on the resistor element 60. A silicide block layer can be used to prevent formation of silicide on the heating elements 70. In addition to the formation of the silicide film 201, in this embodiment element 61 is undoped. Without the application of heat to the programmable fuse structure (which comprises 61 and 201) the silicide film is highly conductive and a low resistance exists. If heat is applied to the fuse structure 61 and 201 via the application of voltages to the heating elements 70 then the silicide film 201 will agglomerate and break resulting in the high resistance of the undoped structure 61. Thus the application of heat via the on chip heating elements will perform the programming function of the fuse structures. Shown in FIG. 4B is a plan view of the fuse 201/61 and heater elements 70 for an embodiment of the instant invention.

Figure 5A:
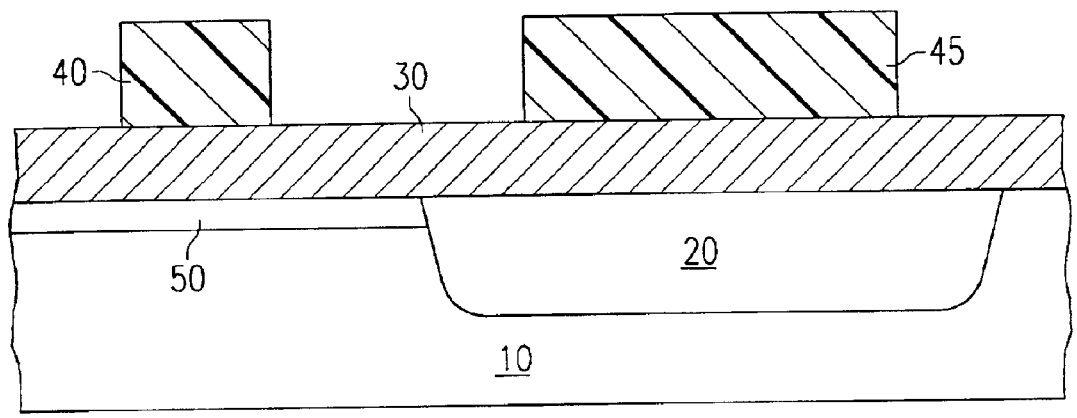
FIGS. 5A–5F are cross-section diagrams showing a further embodiment of on chip heating for resistor trimming and fuse programming.

Shown in FIGS. 5A–5F is a further embodiment of the instant invention. As shown in FIG. 5A, isolation structures 20 are formed in a substrate wafer 10. The substrate wafer 10 can be a bulk silicon wafer, a silicon wafer with an epitaxial layer, or a silicon-on-insulator (SOI) wafer. An SOI wafer would have a buried insulator layer which is not shown in the Figures for clarity. The isolation structures can be shallow trench isolation (STI) structures or local oxidation (LOCOS) structures. Each of these STI or LOCOS structures can be formed using standard CMOS processing technology. A gate dielectric layer 50 is formed in those regions of the substrate 10 where CMOS circuits will be fabricated. This gate dielectric layer can be an oxide, an oxynitride, a silicate, or any combination of these materials. Following the formation of the gate dielectric layer 50, a gate polysilicon or polycrystalline silicon-germanium layer 30 is formed on the substrate. This layer 30 will be used to simultaneously form the CMOS transistor gate structures as well as the heating elements and trim resistors of the instant invention. Following the formation of the polysilicon or polysilicon-germanium (poly-SiGe) layer 30, a masking film (typically photoresist) is formed and patterned 45 to define both transistor gate structures as well as the heating structure.

Figure 5B:
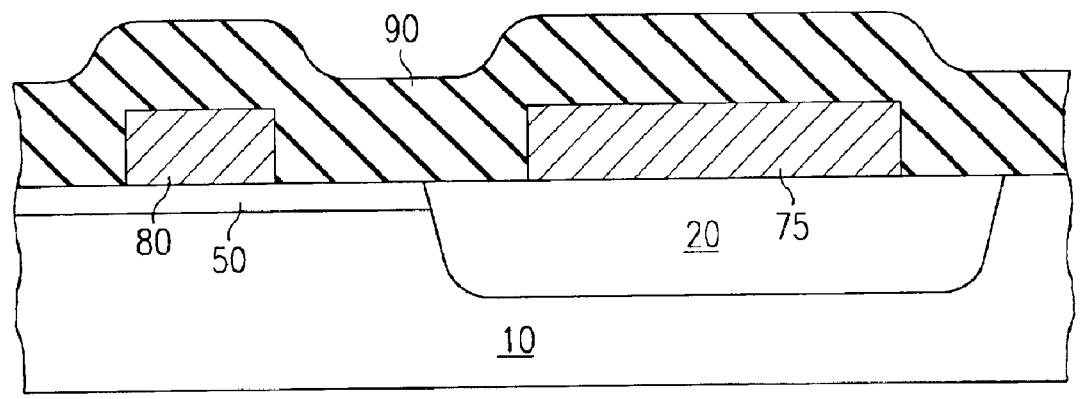
Figure 5C:
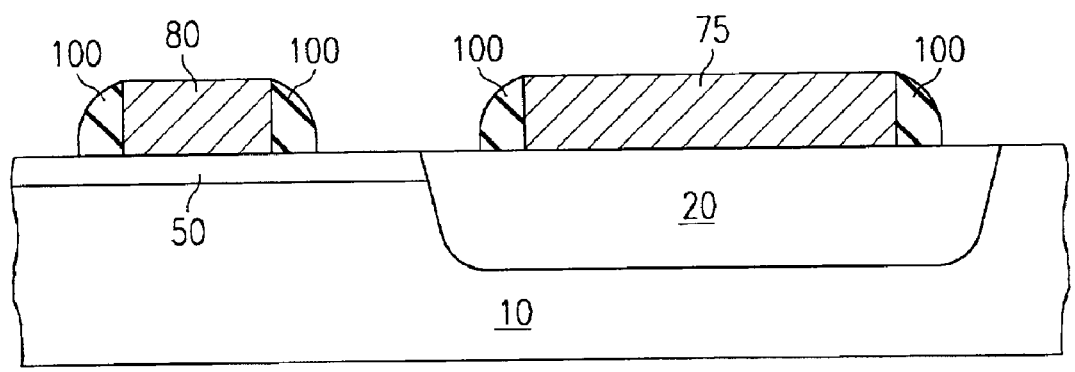
Figure 5D:
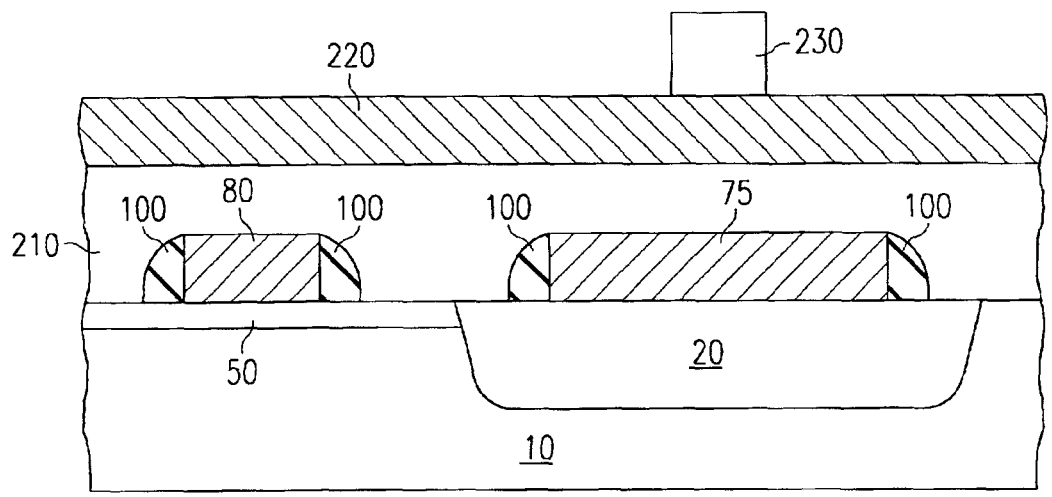
Figure 5E:
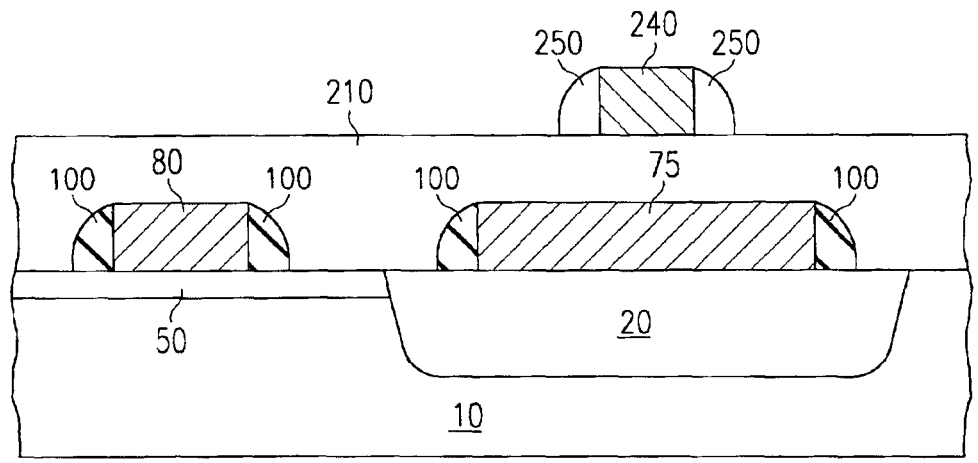

Shown in FIG. 5B is the polysilicon or poly-SiGe layer 30 after etching to simultaneously form the transistor gate structure 80 and the heating structure 75. The heating structure is formed on the isolation structure 20. Following the formation of the structures 75 and 80, an insulator layer containing nitride or oxide 90 is formed on the substrate covering and enclosing the structures 75 and 80. An important property of the layer 90 is that it be an electrical insulator and a good thermal conductor. As described above, silicon nitride and/or silicon oxide can be used to form region 90 but any material with these properties can be used. The formation of layer 90 is followed by an etching process that results in the formation of the sidewall structures 100 as illustrated in FIG. 5C. The gate polysilicon and source-drain implants used as part of the CMOS fabrication process is used to heavily dope the heating structure 75. Following this process, a second insulator layer 210 containing a nitride or an oxide or a combination of both is formed and planarized on the structure shown in FIG. 5C. This planar layer 210 can be formed by conformal film deposition followed by a standard chemical mechanical process or etch back. This is followed by the formation of a second layer 220 of polysilicon, poly-SiGe, or both on the second insulator layer 210. A masking layer is formed and patterned 230 to define the resistor structure or fuse structure. Shown in FIG. 5E is the structure of FIG. 5D following etching of the layer 220 to form the resistor or fuse element 240 and the sidewall structures 250. Standard semiconductor processing steps such as contacts, via formation, metallization, and passivation can be used to complete the fabrication process. In operation, a voltage is applied to the heating element 75 which will heat the resistive element 240 allowing resistor trimming or fuse programming to take place using a methodology similar to that described previously.

Figure 5F:
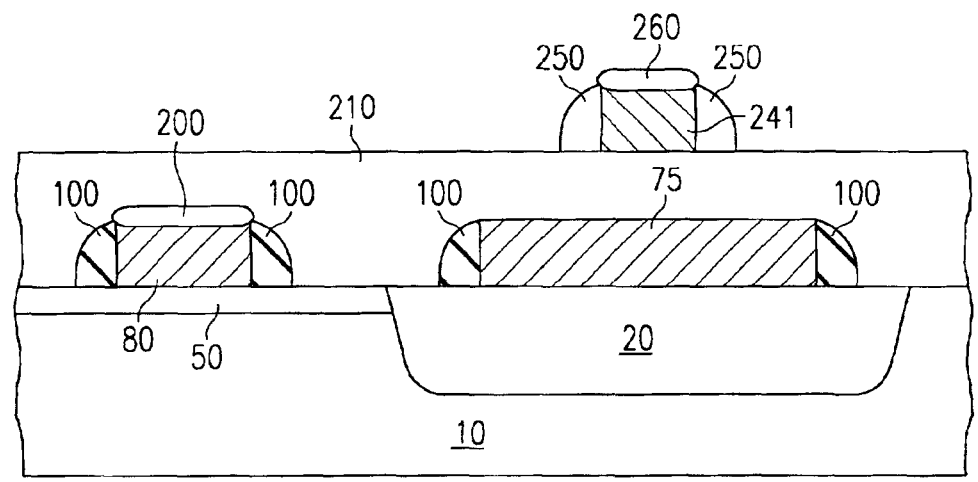

Shown in FIG. 5F is a further embodiment. Here a silicide film 260 is formed on the structure 241 which is left undoped. Heat applied to the fuse structure 241/260 through voltage to the heating element 75 will cause the silicide film 260 to break resulting in a high resistance current path.

Figure 6:
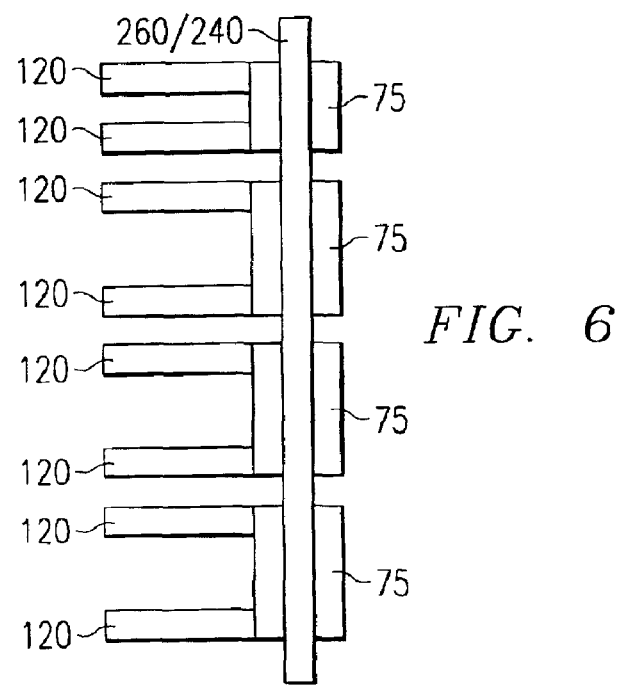
FIG. 6 is a plan layout showing a further embodiment of a resistor trimming device.
Figure 7:
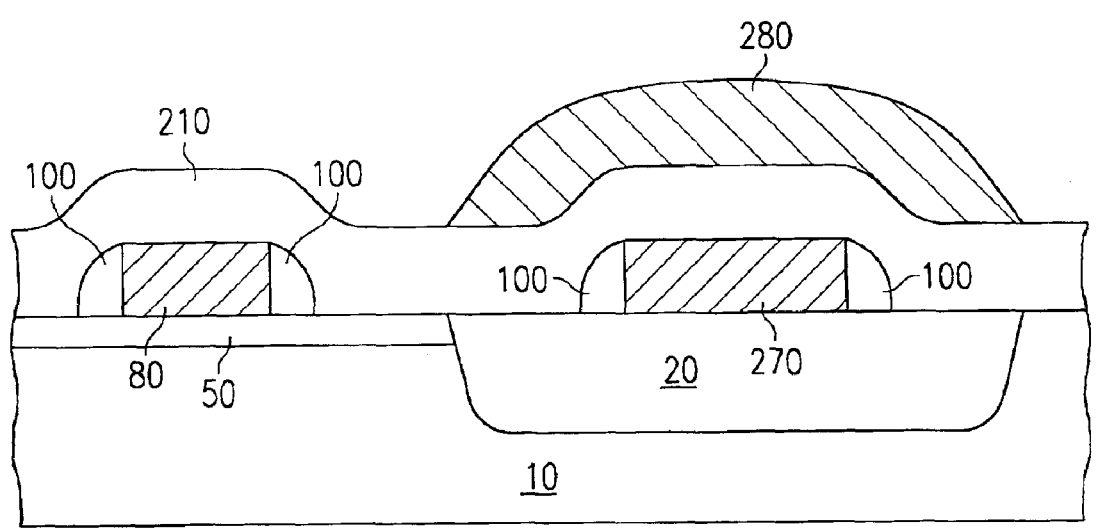
FIG. 7 is a cross-section of a further embodiment of a resistor trimming structure.

Shown in FIG. 6 is a layout which utilizes the structure shown in FIGS. 5A–5E. The layout shows a fuse element 260/241 but can be applied to resistor trimming by replacing the fuse element 260/241 with a trim resistor element 240. A further embodiment of the instant invention is shown in FIG. 7. Here the resistor element 270 is formed beneath the heating element 280.

All of the above described embodiments of the instant invention have been shown as being formed on isolation structures in silicon substrates. It should be noted that an important requirement of the embodiments of the instant invention is that they be formed on insulating structures. These insulating structures can be STI or LOCOS isolation structures formed in semiconductor substrates as described above, or they can be glass substrates as used in the formation of thin film transistor circuits. In fact the embodiments of the instant invention can be formed on any insulator used in integrated circuit manufacture.

The advantages of the instant invention include providing a simple non-intrusive electrical trimming technique for manufacturing trimmable polysilicon and/or poly-SiGe integrated resistors for high precision IC applications. The above described technique is simple, cost-effective, and adds no process complexity to a standard CMOS or BiCMOS technology. The resistor trimming occurs at much lower current densities than those used in standard polysilicon electrical trimming techniques. This technique also allows electrical testing of the circuit under nominal operating conditions during the resistor trim to target method described above. In addition, diode isolated pads connections are not required for trimming the resistor but can be used.

While this invention has been described with reference to illustrative embodiments, this description is not intended to be construed in a limiting sense. Various modifications and combinations of the illustrative embodiments, as well as other embodiments of the invention will be apparent to persons skilled in the art upon reference to the description. It is therefore intended that the appended claims encompass any such modifications or embodiments.

We claim:

1. An integrated circuit trim resistor structure with on-chip heaters, comprising:

providing a substrate with at least one isolation structure;

a doped polysilicon trim resistor structure on said isolation structure; and at least one heating structure on said isolation structure adjacent to said trim resistor structure and separated from said trim resistor structure by a heat conducting electrical insulator.

2. The integrated circuit trim resistor structure of claim 1 wherein said heating structure comprises a material selected from the group consisting of silicon and silicon-germanium.

3. The integrated circuit trim resistor structure of claim 1 wherein Said heat conducting electrical insulator comprises a material selected from the group consisting of silicon oxide and silicon nitride.

4. An integrated circuit trim resistor structure with on-chip heaters, comprising:

providing a substrate with at least one isolation structure;

a heating structure on said isolation structure; a heat conducting electrical insulator on said heating structure; and a doped polysilicon trim resistor structure on said heat conducting electrical insulator.

5. The integrated circuit trim resistor structure of claim 4 wherein said heating structure comprises a material selected from the group consisting of silicon and silicon-germanium.

6. The integrated circuit trim resistor structure of claim 4 wherein said heat conducting electrical insulator comprises a material selected from the group consisting of silicon oxide and silicon nitride.

* * * * *